United States Patent
Liu et al.

(10) Patent No.: US 8,753,971 B2
(45) Date of Patent: Jun. 17, 2014

(54) DUMMY METAL DESIGN FOR PACKAGING STRUCTURES

(75) Inventors: Tzuan-Horng Liu, Longtan Township (TW); Shang-Yun Hou, Jubei (TW); Shin-Puu Jeng, Hsin-Chu (TW); Wei-Cheng Wu, Hsin-Chu (TW); Hsiu-Ping Wei, Dajia Town (TW); Chih-Hua Chen, Jhubei (TW); Chen-Cheng Kuo, Chu-Pei (TW); Chen-Shien Chen, Zhubei (TW); Ming Hung Tseng, Toufen Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 266 days.

(21) Appl. No.: 13/427,430

(22) Filed: Mar. 22, 2012

(65) Prior Publication Data

US 2012/0178252 A1 Jul. 12, 2012

Related U.S. Application Data

(63) Continuation of application No. 12/750,468, filed on Mar. 30, 2010, now Pat. No. 8,193,639.

(51) Int. Cl.
*H01L 21/44* (2006.01)

(52) U.S. Cl.
USPC .................. 438/613; 257/737; 257/E23.021

(58) Field of Classification Search
USPC .......................... 438/613; 257/737, E23.021
See application file for complete search history.

(56) References Cited

U.S. PATENT DOCUMENTS

| | | | |
|---|---|---|---|
| 6,218,281 B1 | 4/2001 | Watanabe et al. |
| 6,229,220 B1 | 5/2001 | Saitoh et al. |
| 6,578,754 B1 | 6/2003 | Tung |
| 7,538,430 B2 | 5/2009 | Yoshioka et al. |
| 7,776,627 B2 | 8/2010 | Jeng et al. |
| 7,807,506 B2 | 10/2010 | Beer et al. |
| 7,989,318 B2 | 8/2011 | Yang et al. |
| 7,993,972 B2 | 8/2011 | Lin et al. |
| 2008/0091457 A1 | 4/2008 | Delson |
| 2010/0117081 A1 | 5/2010 | Obuchi et al. |
| 2010/0187688 A1 | 7/2010 | Hochstenbach |
| 2011/0115073 A1 | 5/2011 | Chen |
| 2011/0175220 A1 | 7/2011 | Kuo et al. |
| 2011/0186986 A1 | 8/2011 | Chuang et al. |
| 2011/0248404 A1 | 10/2011 | Chiu et al. |

FOREIGN PATENT DOCUMENTS

JP 2008-294127 A 12/2008

*Primary Examiner* — Sonya D McCall Shepard
(74) *Attorney, Agent, or Firm* — Slater & Matsil, L.L.P.

(57) ABSTRACT

A method of forming an integrated circuit structure is provided. The method includes forming a metal pad at a major surface of a semiconductor chip, forming an under-bump metallurgy (UBM) over the metal pad such that the UBM and the metal pad are in contact, forming a dummy pattern at a same level as the metal pad, the dummy pattern formed of a same metallic material as the metal pad and electrically disconnected from the metal pad, and forming a metal bump over the UBM such that the metal bump is electrically connected to the UBM and no metal bump in the semiconductor chip is formed over the dummy pattern.

20 Claims, 8 Drawing Sheets

DUMMY METAL DESIGN FOR PACKAGING STRUCTURES

This application is a continuation of U.S. patent application Ser. No. 12/750,468, entitled "Dummy Metal Design for Packaging Structures," filed Mar. 30, 2010, which application is incorporated herein by reference.

TECHNICAL FIELD

This disclosure relates generally to integrated circuits, and more particularly to dummy metal design for packaging structures.

BACKGROUND

Modern integrated circuits are formed on semiconductor chips. To increase manufacturing throughput and to lower manufacturing costs, the integrated circuits are manufactured in semiconductor wafers, each containing many identical semiconductor chips. After the integrated circuits are manufactured, semiconductor chips are sawed from the wafers and packaged before they can be used.

In typical packaging processes, semiconductor chips (also referred to as dies in the art) are first attached to package substrates. This includes physically securing the semiconductor chips on the package substrates, and connecting bond pads on the semiconductor chips to bond pads on the package substrates. Underfill, which typically comprises epoxy, is used to further secure the bonding. The semiconductor chips may be bonded using either flip-chip bonding or wire bonding. The resulting structures are referred to as package assemblies.

FIG. 1 illustrates a cross-sectional view of a conventional chip, which includes substrate 10, electrical connections 8, aluminum pads 2, copper posts 4, and solder regions 6. Solder regions 6 are used to bond to a package substrate (not shown). Electrical connections 8 electrically connect copper posts 4 to integrated circuits at the surface of substrate 10.

After the semiconductor chips are bonded onto the package substrates, the solder regions that join the semiconductor chips with the package substrates often suffer from cracking. This is caused by the stress resulting from the difference in coefficients of thermal expansion (CTE) between the package substrates and the semiconductor chips. The difference in CTEs of different layers of the package substrates and the semiconductor chips also results in stresses. It was observed that with the increase in the size of the package substrates and the semiconductor chips, the stress increases. As a result of the increased stresses, the solder cracking becomes more severe and delamination may occur between different layers of the semiconductor chips. Particularly, the delamination is likely to occur between low-k dielectric layers in the semiconductor chips.

SUMMARY

In accordance with one aspect, an integrated circuit structure includes a semiconductor chip, a metal pad at a major surface of the semiconductor chip, and an under-bump metallurgy (UBM) over and contacting the metal pad. A metal bump is formed over and electrically connected to the UBM. A dummy pattern is formed at a same level, and formed of a same metallic material, as the metal pad.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

Novel packaging structures in semiconductor chips are presented in accordance with an embodiment. The variations of the embodiment are then discussed. Throughout the various views and illustrative embodiments, like reference numbers are used to designate like elements.

Figure 1:
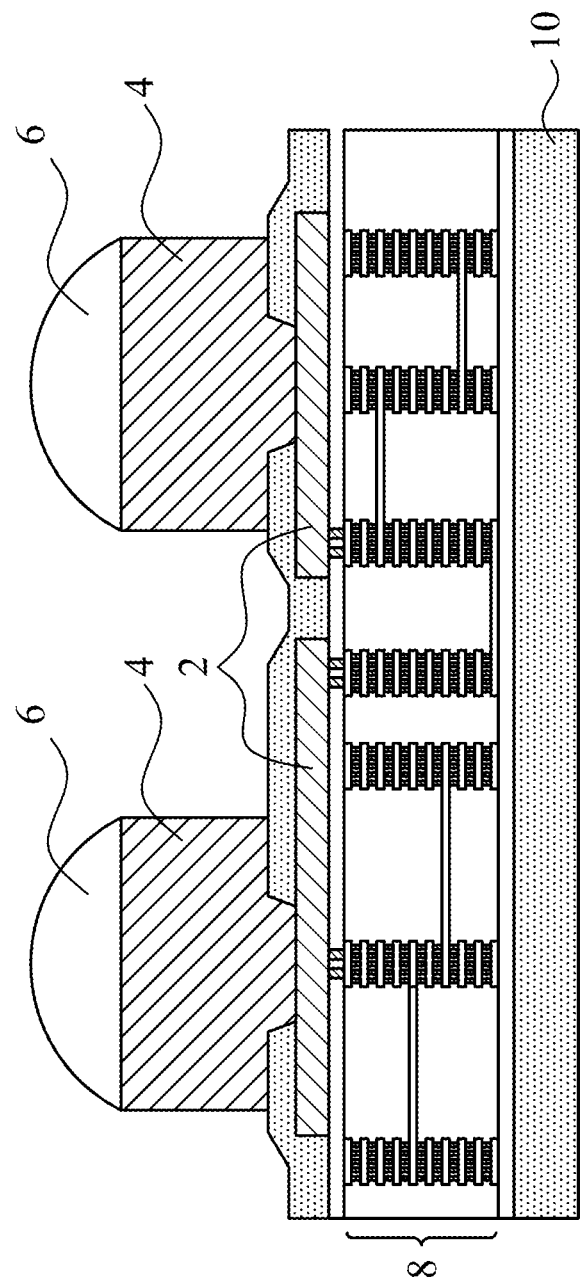
FIG. 1 illustrates a cross-sectional view of a portion of a conventional semiconductor chip.
Figure 2A:
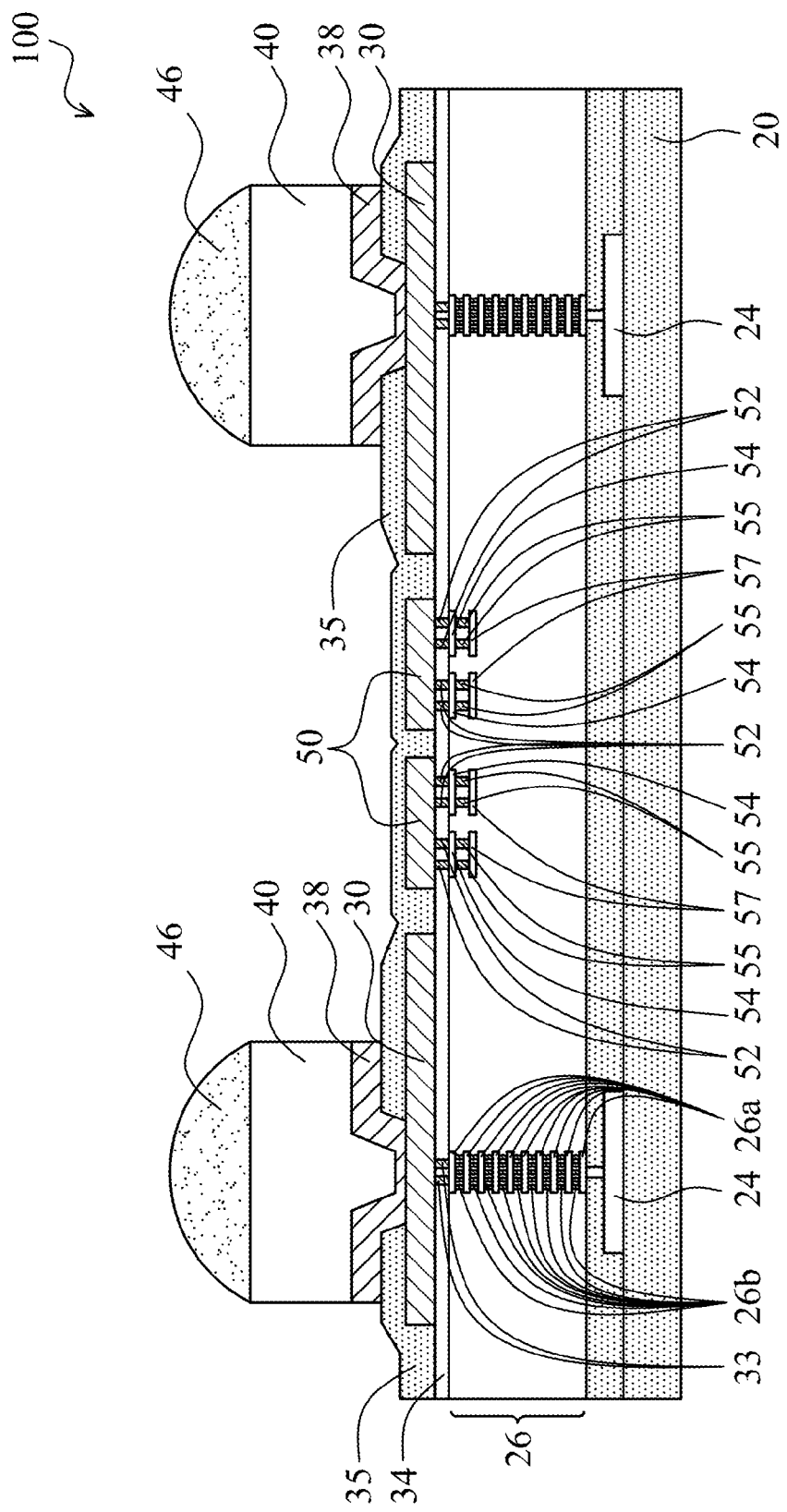
FIGS. 2A and 2B are cross-sectional views of semiconductor chips in accordance with an embodiment.

FIG. 2A illustrates a portion of semiconductor chip 100, which may also be a portion of a wafer. Chip 100 includes substrate 20, on which active circuits 24 are formed. Substrate 20 may be a semiconductor substrate formed of commonly used semiconductor materials, such as silicon, silicon germanium, or the like. Active circuits 24 may include complementary metal-oxide-semiconductor (CMOS) transistors, resistors, capacitors (not shown), and/or the like. Interconnect structure 26 is formed over active circuits 24, and is used to interconnect portions of active circuits 24, and to connect active circuits 24 to overlying metal pads and solder bumps. Interconnect structure 26 includes a plurality of metallization layers comprising metal lines 26a and vias 26b in a plurality of dielectric layers, which are commonly referred to as inter-metal dielectrics (IMDs). The dielectric layers in interconnect structure 26 may be low-k dielectric layers.

Metal pads 30 are formed over interconnect structure 26 and may be electrically connected to active circuits 24 through interconnect structure 26. Metal pads 30 may comprise aluminum, and hence are referred to as aluminum pads 30 throughout the description, although they may also be formed of, or include, other metallic materials, such as copper, silver, gold, nickel, tungsten, alloys thereof, and/or multi-layers thereof. In an embodiment, metal pads 30 are formed of aluminum copper (AlCu).

Dielectric layer 34 is formed over interconnect structure 26. Dielectric layer 34 may also be referred to as being a passivation layer (passivation-1), and may be formed of dielectric materials such as silicon oxide, silicon nitride, undoped silicate glass (USG), and/or multi-layers thereof. Vias 33 are formed in dielectric layer 34 to electrically connect metal pads 30 to interconnect structure 26. In an embodiment, dielectric layer 34 is underlying metal pads 30. In alternative embodiments, dielectric layer 34 may be formed at a same level as metal pads 30.

An additional dielectric layer 35 (alternatively referred to as passivation-2) may be formed over dielectric layer 34.

Under-bump metallurgies (UBMs) 38 are formed on dielectric layer 35, with a portion of each of UBMs 38 extending into dielectric layer 35. Dielectric layer 35 may be formed of polyimide or other dielectric materials such as silicon oxide, silicon nitride, and multi-layers thereof. Metal pads 30 may physically contact UBMs 38.

In an embodiment, UBMs 38 are formed of a composite layer comprising a titanium layer, and a copper layer over the titanium layer. In other embodiments, UBMs 38 may include other metal layers such as a nickel layer or a gold layer. UBMs 38 and the respective underlying metal pads 30 in combination are referred to as bump pad structures.

Metal bumps 40 are formed over UBMs 38. Metal bumps 40 may be formed by forming and patterning a photo resist (not shown) over UBMs 38, and plating a metallic material into openings in the patterned photo resist. The metallic material may comprise copper, and hence the resulting metal bumps 40 are referred to copper bumps 40, although other metals may be used. Optionally, additional layer(s), such as a nickel layer (not shown), and possibly solder layer 46 may be plated over each of copper bumps 40. The photo resist may then be removed, followed by the removal of the portion of UBMs 38 uncovered by copper bumps 40 using a wet etching.

Chip 100 further includes dummy patterns 50 formed at a same level as metal pads 30. Dummy patterns 50 and metal pads 30 may be formed simultaneously and may be formed of a same material, such as AlCu. In an embodiment, the formation of dummy patterns 50 and metal pads 30 include blanket depositing a metal layer, and then performing an etching, which may be a dry etching using $Cl_2$ and $BCl_3$ (Chloride) as etchants. Dummy patterns 50 may not have electrical functions, and may not be electrically connected to any of active circuits 24 on substrate 20, and/or any of metal bumps 40.

In an embodiment, only dummy patterns 50 are formed, while no dummy metal patterns are formed underlying and connected to dummy patterns 50. In alternative embodiments, as shown in FIG. 2A, additional dummy patterns are formed, which may include dummy redistribution vias 52 and/or dummy metal lines/pads 54. The formation of addition dummy patterns may improve the adhesion of dummy patterns 50 to dielectric layers 34 and 35, and improve the stress redistribution in chip 100 so that local stresses may be redistributed to larger regions of chip 100. In yet other embodiments, more dummy patterns 55 and 57 may be formed underlying dummy metal lines/pads 54 and extend into more underlying IMDs.

Figure 2B:
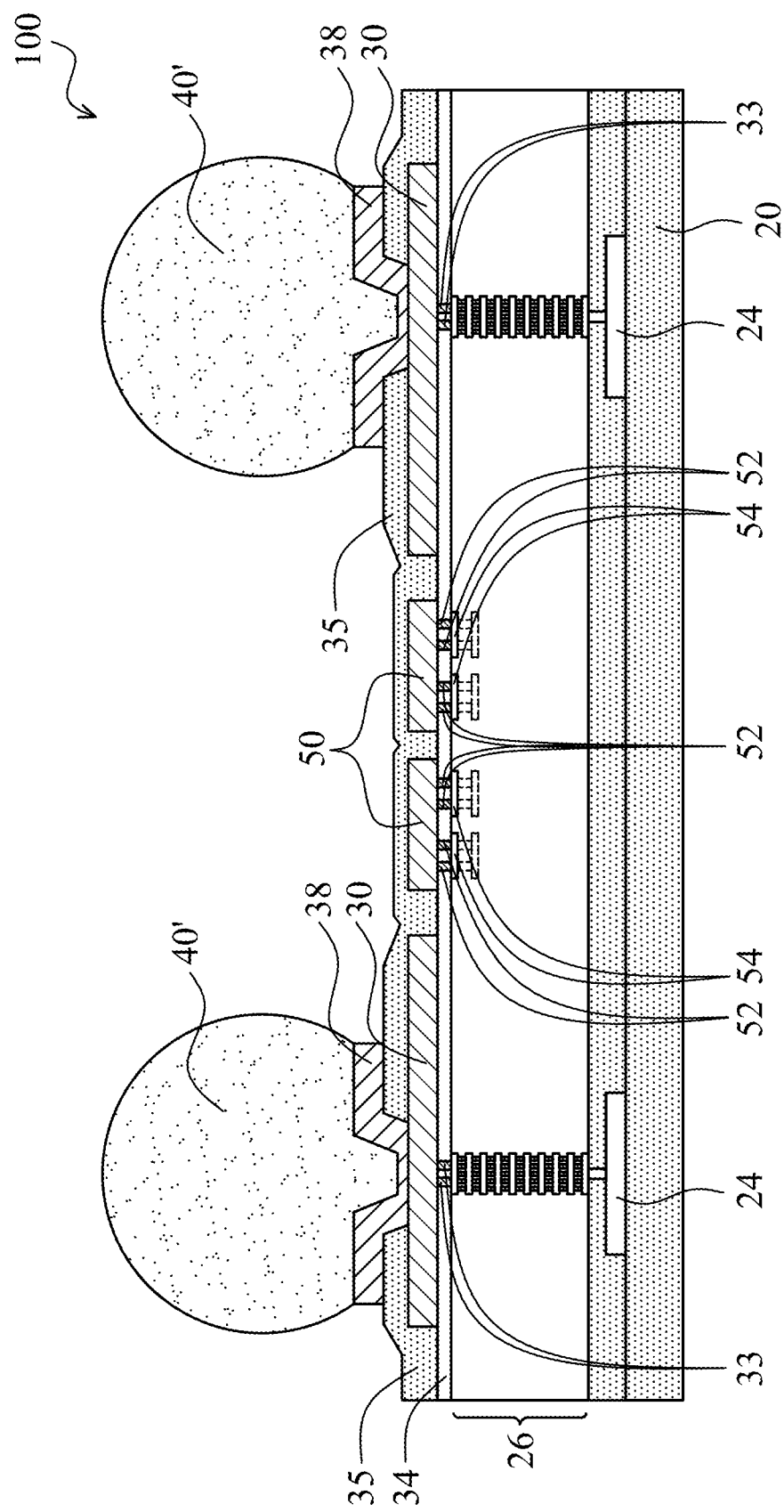

In alternative embodiments, as shown in FIG. 2B, instead of copper bumps 40, solder bumps 40' are formed or mounted on UBMs 38. Similarly, in FIGS. 3A and 4A, copper bumps 40 may also be replaced by solder bumps 40'.

Figure 2C:
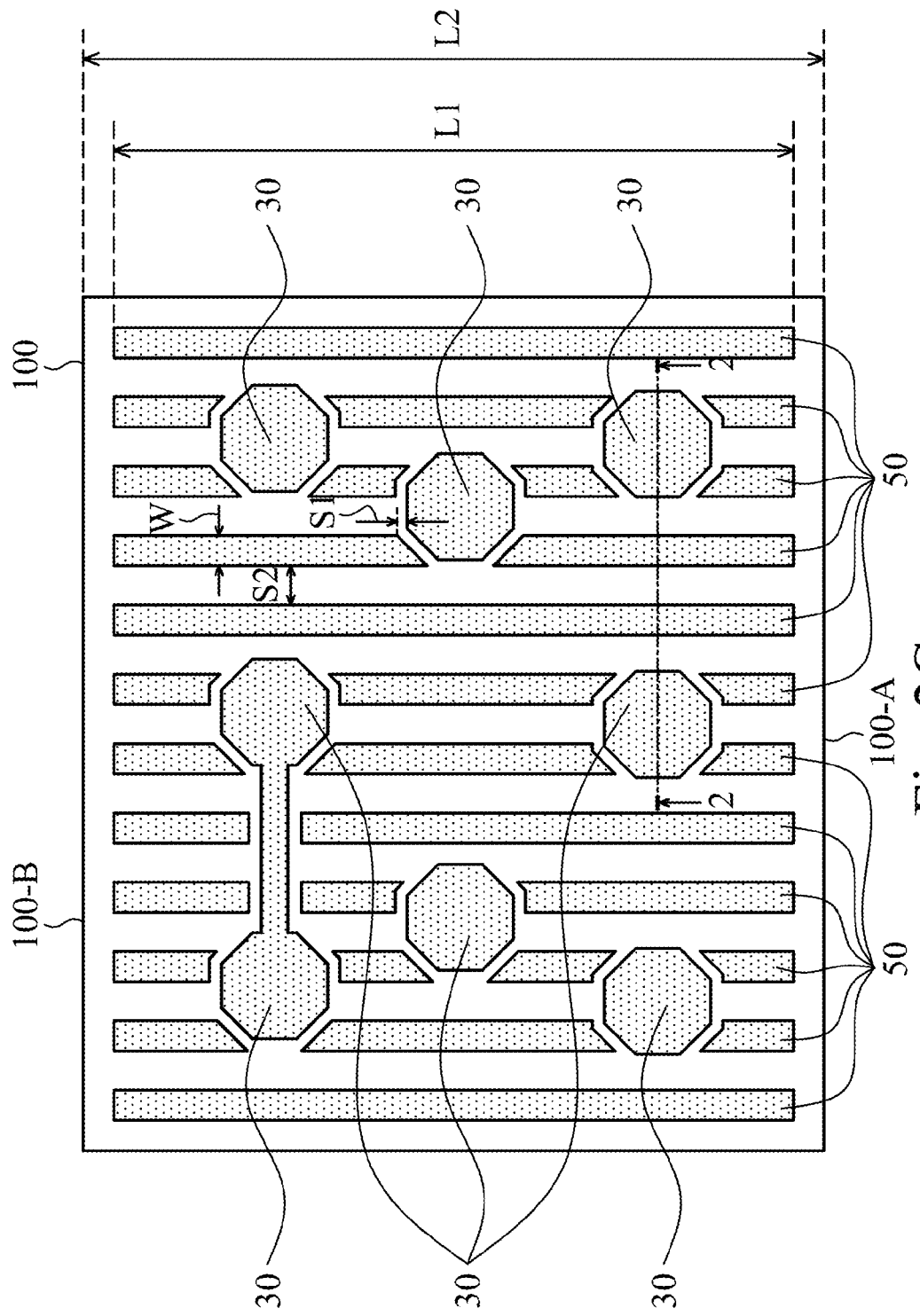
FIG. 2C illustrates a top view of the structures shown in FIGS. 2A and/or 2B.

FIG. 2C illustrates a top view of a portion of the structure as shown in FIGS. 2A and/or 2B in accordance with an embodiment. The cross-sectional views shown in FIGS. 2A and 2B may be obtained from the plane crossing line 2-2 in FIG. 2C. For simplicity, copper bumps 40 and UBMs 38 are not shown. In the top view, metal pads 30 are illustrated as having octagon shapes, although they may have other shapes, such as hexagon, square, circle, and the like. Dummy patterns 50 are distributed substantially throughout chip 100. In an embodiment, as shown in FIG. 2C, dummy patterns 50 may be in the form of dummy strips extending from close to edge 100_A of chip 100 to close to the opposite edge 100_B, unless metal pads 30 are formed in their way, in which cases, dummy patterns 50 are broken into smaller pieces. Accordingly, the length L1 of some of dummy patterns 50 may be greater than, for example, about 50 percent or greater, of the respective length L2 of chip 100. The spacing S1 between metal pads 30 and dummy patterns 50 may be greater than about 2 µm, or even greater than about 3 µm, to prevent dummy patterns 50 from being shorted to metal pads 30. It is realized, however, that the dimensions recited throughout the description are merely examples, and may be changed to other suitable values. In an exemplary embodiment, the spacing S2 between parallel dummy patterns 50 may be about 10 µm and about 20 µm, while the width W of dummy patterns 50 may be between about 5 µm and about 35 µm. Accordingly, the pattern density including all of metal pads 30 and dummy patterns 50 in chip 100 may be greater than about 50 percent, and may be between about 50 percent and about 80 percent.

Figure 3A:
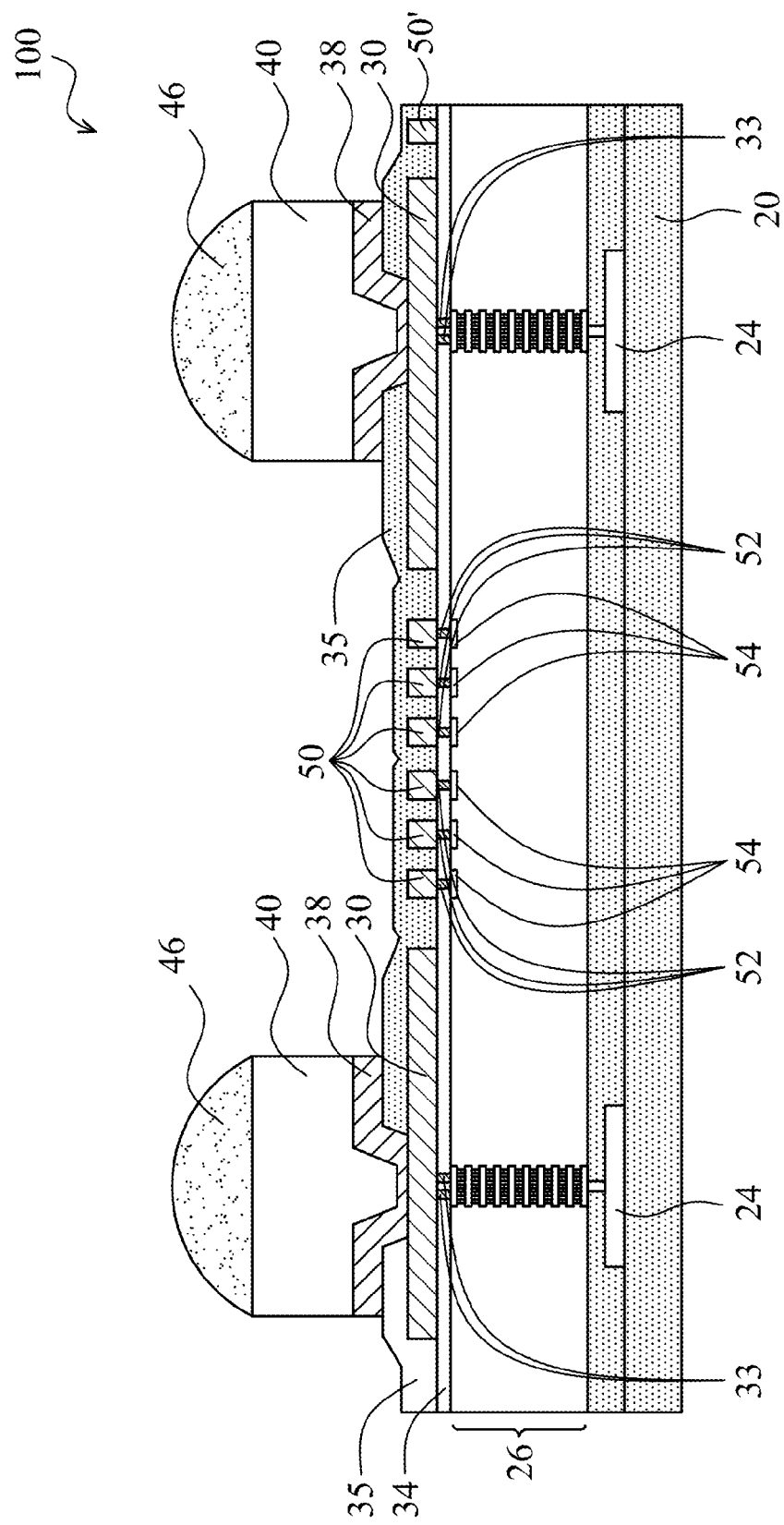
FIGS. 3A through 4B are cross-sectional views and top views of semiconductor chips in accordance with alternative embodiments.
Figure 3B:
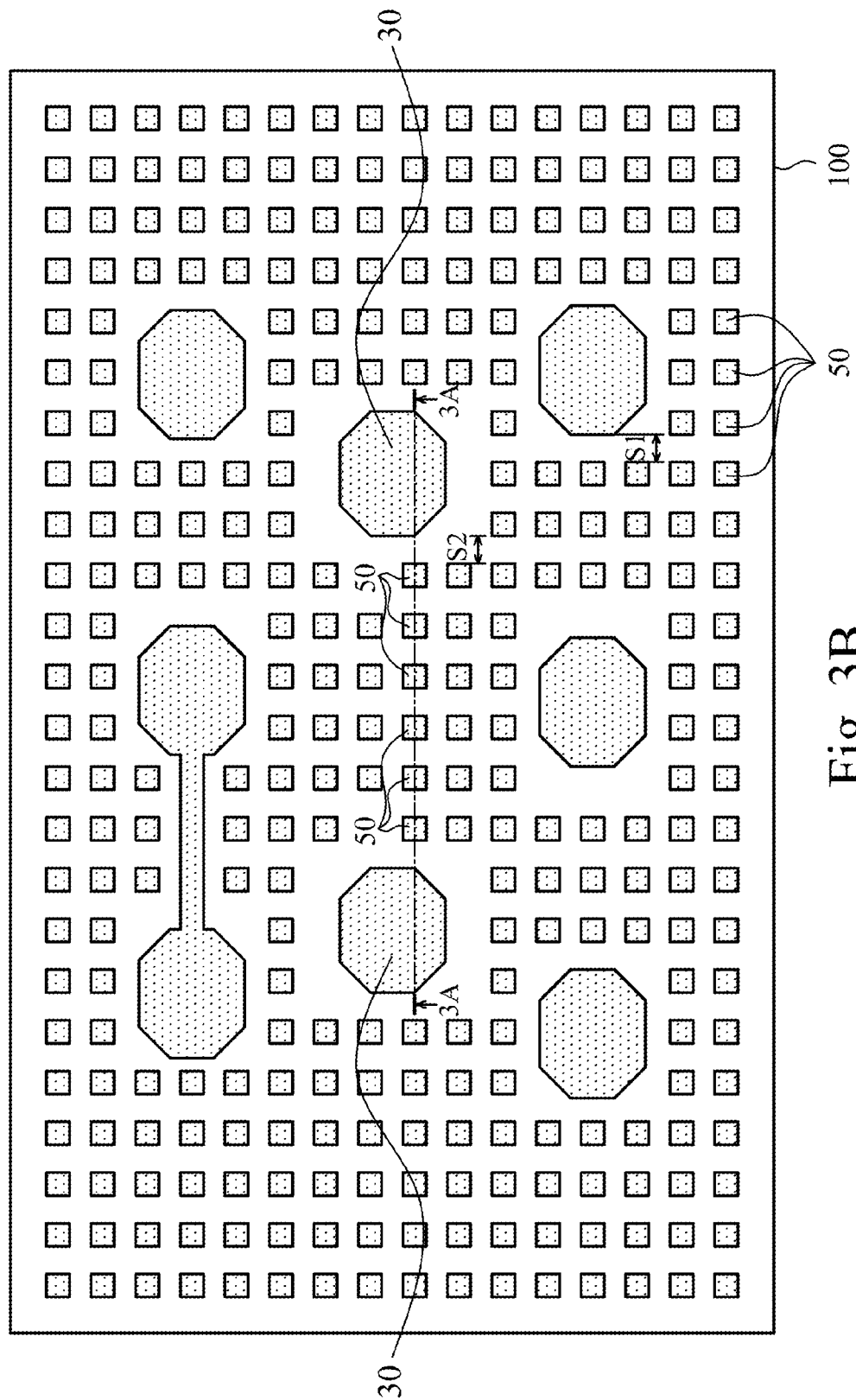

FIGS. 3A and 3B illustrate a cross-sectional view and a top view, respectively, of semiconductor chip 100 in accordance with an alternative embodiment. FIG. 3A illustrates a cross-sectional view of a portion of the structure shown in FIG. 3B, wherein the cross-sectional view as shown in FIG. 3A is obtained in the plane crossing line 3A-3A in FIG. 3B. This embodiment is similar to the embodiment shown in FIGS. 2A-2C except dummy patterns 50 have different shapes. Referring to FIG. 3B, in an embodiment, dummy patterns 50 are squares (or rectangles with close lengths and widths) with the length and/or width being between, for example, about 1 µm and about 5 µm, although different dimensions may also be used. The spacing S1 between metal pads 30 and neighboring dummy patterns 50 may be greater than about 2 µm, or even greater than about 3 µm. In an exemplary embodiment, the spacing S2 between neighboring dummy patterns 50 may be about 2 µm and about 3 µm. Accordingly, the pattern density including metal pads 30 and dummy patterns 50 may be between about 20 percent and about 50 percent.

Referring again to FIG. 3A, dummy patterns 52 and 54 may be, or may not be, formed underlying dummy patterns 50. Furthermore, since IMD layers may be used for electrical routing, some of dummy patterns 50 may have underlying dummy patterns 52 and/or 54, while some other dummy patterns (for example, dummy pattern 50') may have no underlying dummy patterns 52 and/or 54, depending on whether spaces are available.

Figure 4A:
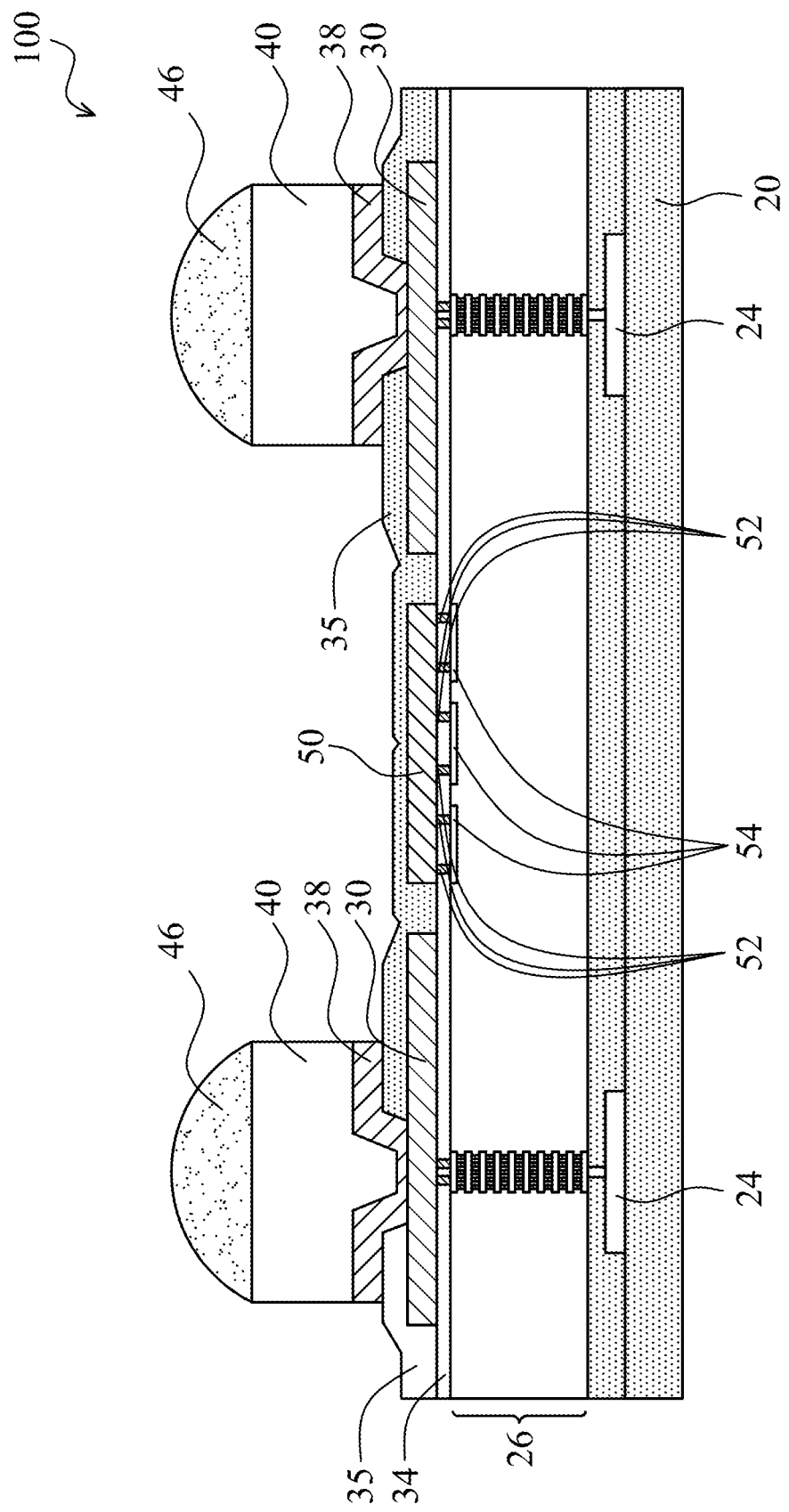
Figure 4B:
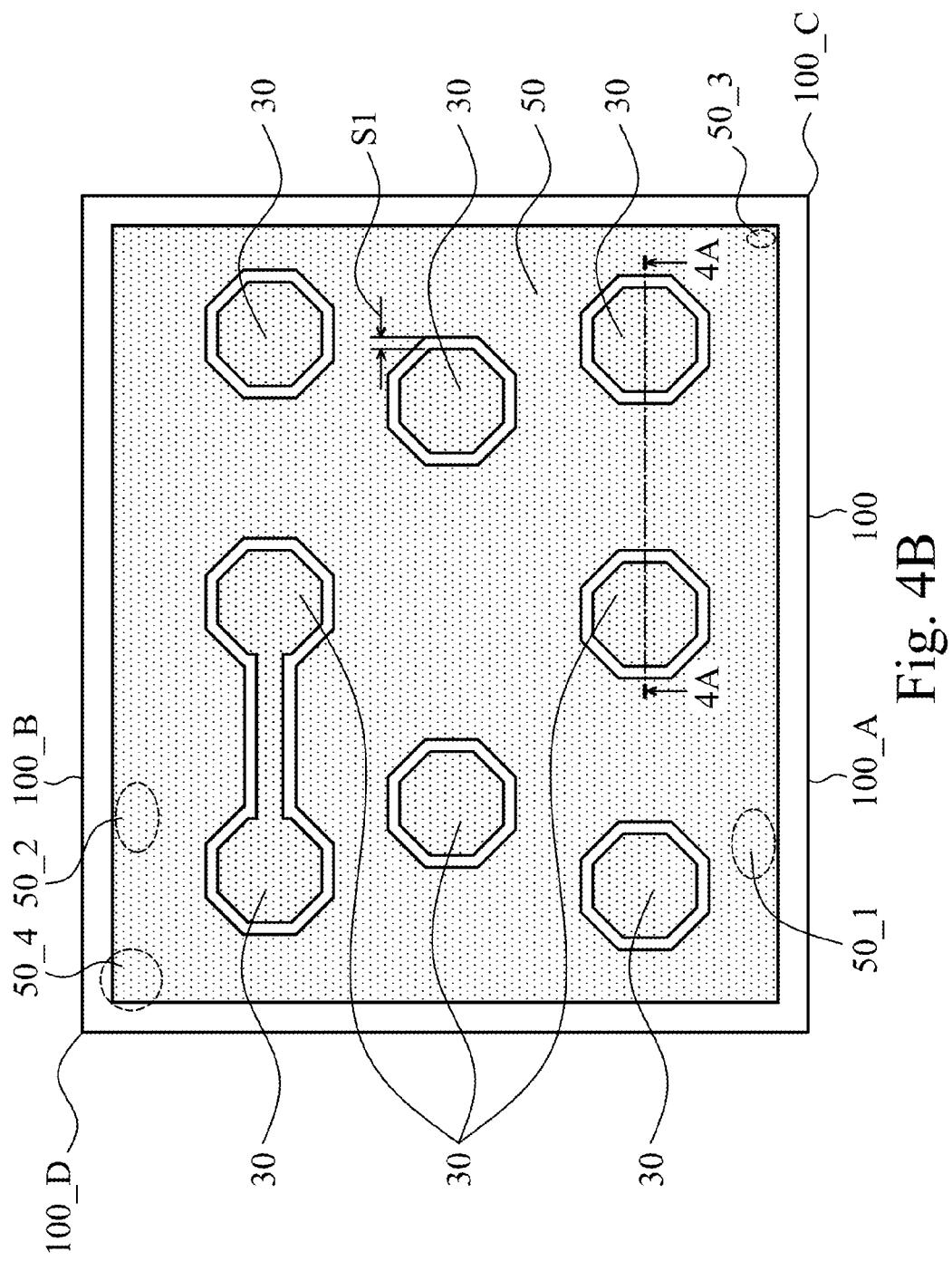

FIGS. 4A and 4B illustrates a cross-sectional view and a top view, respectively, of semiconductor chip 100 in accordance with yet other embodiments. FIG. 4A illustrates a cross-sectional view of a portion of the structure shown in FIG. 4B, wherein the cross-sectional view as shown in FIG. 4A is obtained in the plane crossing line 4A-4A in FIG. 4B. Referring to FIG. 4B, dummy pattern(s) 50 is in the form of a dummy pattern shield that encircles more than one, and possibly all, metal pads 30 in chip 100. In an embodiment, there is only one continuous dummy pattern 50 formed in chip 100. In other words, all dummy patterns 50, or substantially all dummy patterns 50 in chip 100, are interconnected to form one continuous dummy pattern. Accordingly, dummy pattern 50 may have an area greater than about 80 percent the area of chip 100. Metal pads 30, on the other hand, are separated from each other by dummy pattern 50. In alternative embodiments, dummy pattern(s) 50 in chip 100 only includes a limited number (for example, less than about ten) of dummy patterns shields that are separated from each other. In an embodiment, with dummy pattern 50 extending through substantially an entirety of chip 100, portion 50_1 of dummy pattern 50 close to edge 100_A of chip 100 may be electrically connected to portion 50_2 of dummy pattern 50 close to the opposite edge 100_B. Further, portion 50_3 of dummy pattern 50 close to corner 100_C of chip 100 may be electrically connected to portion 50_4 of dummy pattern 50 close to the opposite corner 100_D. Again, the spacing S1 between metal pads 30 and neighboring portions of dummy pattern 50 may be greater than about 2 μm, or even greater than about 3 μm. The pattern density including metal pads 30 and dummy pattern 50 throughout chip 100 may be greater than about 90 percent. Similarly, a plurality of dummy patterns 52 and 54 may be formed underlying dummy pattern (dummy pattern shield) 50.

It is observed that by forming dummy patterns at the same level as metal pads 30, the reliability of the resulting chips/wafers may be improved, possibly due to the stress-redistribution resulting from dummy patterns 50. Experiments have been performed to evaluate the effect of dummy patterns to the reliability of the respective chips. In a first group and a second group of sample wafers, dummy patterns were made according to what are illustrated in FIGS. 2A and 4A, respectively, wherein dummy patterns 50 were formed, and no dummy patterns 52 and 54 were formed. It was observed that the failure rates of the first and the second groups of sample wafers are both about 20 percent. However, when no dummy patterns 50 were formed, the failure rate of resulting chips increases to about 83 percent under similar test conditions. This result indicates that dummy patterns 50 have a significant effect to the improvement in the reliability of chips.

Further, a third group of sample chips were made according to the structure shown in FIG. 4A, with dummy patterns 50, 52 and 54 being formed. It was observed that the failure rate of the third group of sample chips is further reduced to zero percent.

A method of forming an integrated circuit structure. The method includes forming a metal pad at a major surface of a semiconductor chip, forming an under-bump metallurgy (UBM) over the metal pad such that the UBM and the metal pad are in contact, forming a dummy pattern at a same level as the metal pad, the dummy pattern formed of a same metallic material as the metal pad and electrically disconnected from the metal pad, and forming a metal bump over the UBM such that the metal bump is electrically connected to the UBM and no metal bump in the semiconductor chip is formed over the dummy pattern.

A method of forming an integrated circuit structure. The method includes forming a passivation layer at a major surface of a semiconductor chip, forming a plurality of metal pads under the passivation layer, forming a plurality of under-bump metallurgies (UBMs), each of the UBMs having a first portion disposed over the passivation layer and a second portion extending into the passivation layer and contacting a respective one of the plurality of metal pads, distributing a plurality of dummy patterns throughout the semiconductor chip, the dummy patterns formed from parallel dummy metal strips disposed at a same level as, and formed of a same material as, the plurality of metal pads, and the dummy patterns electrically disconnected from the metal pads, and forming a plurality of metal bumps such that each of the metal bumps is disposed over and contacts one of the plurality of UBMs and no metal bump in the semiconductor chip is formed over one of the dummy patterns.

A method of forming an integrated circuit structure. The method includes forming a passivation layer at a major surface of a semiconductor chip, forming a plurality of metal pads under the passivation layer, forming a plurality of under-bump metallurgies (UBMs), each of the UBMs having a first portion disposed over the passivation layer and a second portion extending into the passivation layer and contacting a respective one of the plurality of metal pads, forming a plurality of metal bumps such that each of the metal bumps is disposed over and contacts one of the plurality of UBMs, and forming a dummy metal shield at a same level as, and from a same material as, the plurality of metal pads, the dummy metal shield encircling the plurality of metal pads.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit structure, comprising:
   forming a metal pad at a major surface of a semiconductor chip;
   forming an under-bump metallurgy (UBM) over the metal pad such that the UBM and the metal pad are in contact;
   forming a dummy pattern at a same level as the metal pad, the dummy pattern formed of a same metallic material as the metal pad and electrically disconnected from the metal pad; and
   forming a metal bump over the UBM such that the metal bump is electrically connected to the UBM and no metal bump in the semiconductor chip is formed over the dummy pattern.

2. The method of claim 1, further comprising forming the metal bump such that no metal bump in the semiconductor chip is electrically connected to the dummy pattern.

3. The method of claim 2, further comprising forming the dummy pattern such that the dummy pattern is electrically disconnected from all metal bumps and active integrated circuits in the semiconductor chip.

4. The method of claim 1, further comprising forming the metal bump as one of a copper bump and a solder bump.

5. The method of claim 1, further comprising forming the dummy pattern as a dummy metal strip extending substantially from close to one edge to close to an opposite edge of the semiconductor chip.

6. The method of claim 1, further comprising forming the dummy pattern as a continuous dummy metal shield fully encircling a plurality of the metal pads.

7. The method of claim 6, further comprising forming the continuous dummy metal shield to extend substantially continuously from one edge to an opposite edge of the semiconductor chip.

8. The method of claim 6, further comprising forming the continuous dummy metal shield to extend substantially continuously from one corner to an opposite corner of the semiconductor chip.

9. The method of claim 1, further comprising forming a dummy redistribution via underlying and physically contacting the dummy pattern.

10. The method of claim 9, further comprising forming a dummy metal feature underlying the dummy redistribution via, with the dummy metal feature being electrically connected to the dummy redistribution via and the dummy pattern.

11. A method of forming an integrated circuit structure, comprising:
   forming a passivation layer at a major surface of a semiconductor chip;
   forming a plurality of metal pads under the passivation layer;
   forming a plurality of under-bump metallurgies (UBMs), each of the UBMs having a first portion disposed over the passivation layer and a second portion extending into the passivation layer and contacting a respective one of the plurality of metal pads;
   distributing a plurality of dummy patterns throughout the semiconductor chip, the dummy patterns formed from parallel dummy metal strips disposed at a same level as, and formed of a same material as, the plurality of metal pads, and the dummy patterns electrically disconnected from the metal pads; and
   forming a plurality of metal bumps such that each of the metal bumps is disposed over and contacts one of the plurality of UBMs and no metal bump in the semiconductor chip is formed over one of the dummy patterns.

12. The method of claim 11, further comprising forming the plurality of dummy patterns from dummy pattern strips extending substantially from close to one edge to close to an opposite edge of the semiconductor chip.

13. The method of claim 11, further comprising forming the plurality of metal bumps as one of copper bumps and solders bumps.

14. The method of claim 11, further comprising:
   forming a dummy redistribution via underlying and physically contacting one of the plurality of dummy patterns; and
   forming a dummy metal feature underlying and electrically connected to the dummy redistribution via.

15. A method of forming an integrated circuit structure, comprising:
   forming a passivation layer at a major surface of a semiconductor chip;
   forming a plurality of metal pads under the passivation layer;
   forming a plurality of under-bump metallurgies (UBMs), each of the UBMs having a first portion disposed over the passivation layer and a second portion extending into the passivation layer and contacting a respective one of the plurality of metal pads;
   forming a plurality of metal bumps such that each of the metal bumps is disposed over and contacts one of the plurality of UBMs; and
   forming a dummy metal shield at a same level as, and from a same material as, the plurality of metal pads, the dummy metal shield encircling the plurality of metal pads.

16. The method of claim 15, further comprising encircling all metal pads in the semiconductor chip with the dummy metal shield and disposing the dummy metal shield at the same level as the plurality of metal pads.

17. The method of claim 15, further comprising situating the dummy metal shield to extend from close to an edge to close to an opposite edge of the semiconductor chip continuously.

18. The method of claim 15, further comprising situating the dummy metal shield to extend from close to a corner to close to an opposite corner of the semiconductor chip continuously.

19. The method of claim 15, further comprising forming all metal features at the same level and from the same material as the dummy metal shield such that all of the metal features have a pattern density greater than about 90 percent.

20. The method of claim 15, further comprising:
   forming a dummy redistribution via underlying and physically contacting the dummy metal shield; and
   forming a dummy metal feature underlying and electrically connected to the dummy redistribution via.

* * * * *